(12) United States Patent
Cai et al.

(10) Patent No.: US 7,564,694 B2
(45) Date of Patent: Jul. 21, 2009

(54) APPARATUS AND METHOD FOR IMPEDANCE MATCHING IN A BACKPLANE SIGNAL CHANNEL

(75) Inventors: Xingjian Cai, Gilbert, AZ (US); Xiao-Ming Gao, Sacramento, CA (US); Qing-Iun Chen, El Dorado Hill, CA (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 11/313,333

(22) Filed: Dec. 21, 2005

(65) Prior Publication Data

US 2007/0139063 A1     Jun. 21, 2007

(51) Int. Cl.
    *H05K 1/18*     (2006.01)
(52) U.S. Cl. ............... 361/763; 361/738; 361/782; 361/794; 174/262; 174/266
(58) Field of Classification Search .......... 361/763, 361/738, 782, 794; 174/262, 266
    See application file for complete search history.

(56) References Cited

U.S. PATENT DOCUMENTS

| | | | | |
|---|---|---|---|---|
| 3,394,234 A | * | 7/1968 | Grace ............... | 360/66 |
| 4,308,559 A | * | 12/1981 | Schiff ............... | 348/159 |
| 5,629,838 A | * | 5/1997 | Knight et al. ....... | 361/782 |
| 6,108,731 A | * | 8/2000 | Suzuki et al. ....... | 710/301 |
| 6,509,807 B1 | * | 1/2003 | Anthony et al. ..... | 333/12 |
| 6,708,243 B1 | | 3/2004 | Leddige et al. | |
| 6,836,810 B1 | | 12/2004 | Klem et al. | |
| 2002/0113673 A1 | * | 8/2002 | Crescenzi et al. ... | 333/247 |
| 2002/0190746 A1 | * | 12/2002 | Abrosimov et al. .. | 326/30 |
| 2003/0089522 A1 | * | 5/2003 | Dances ............... | 174/260 |
| 2003/0161196 A1 | | 8/2003 | Park et al. | |
| 2004/0003163 A1 | * | 1/2004 | Kleveland et al. ... | 710/305 |

(Continued)

FOREIGN PATENT DOCUMENTS

GB     2 238 667 A     6/1991

(Continued)

OTHER PUBLICATIONS

International Search Report for PCT/US2006/047145 (filed Dec. 7, 2006), mailed May 2, 2007 (3 pages).

(Continued)

*Primary Examiner*—Jeremy C Norris
*Assistant Examiner*—Xiaoliang Chen
(74) *Attorney, Agent, or Firm*—Blakely, Sokoloff, Taylor & Zafman LLP (57) ABSTRACT

An apparatus comprising a printed circuit board having a front side and a back side, and having therein a plurality of conductive layers, each conductive layer including one or more signal channels; a stub extending from the front side to the back side, the stub being electrically coupled to at least one signal channel; and an impedance matching terminal electrically coupled to the stub and to a ground. A process comprising providing a printed circuit board including a front side and a back side, and having therein a plurality of conductive layers, each conductive layer including one or more signal channels, and a stub extending from the front side to the back side, the stub being electrically coupled to at least one signal channel and being designed to receive a signal from a component attached to the printed circuit board; and coupling an impedance matching terminal to the stub and to a ground.

16 Claims, 8 Drawing Sheets

U.S. PATENT DOCUMENTS

2004/0139313 A1* 7/2004 Buer et al. .................. 713/150
2005/0023241 A1* 2/2005 Goergen ...................... 216/13
2005/0146390 A1* 7/2005 Baek .......................... 333/33
2006/0071735 A1* 4/2006 Kang .......................... 333/32
2006/0090933 A1* 5/2006 Wig et al. ................... 174/262

OTHER PUBLICATIONS

Written Opinion of the International Searching Authority for PCT/US2006/047145 (filed Dec. 7, 2006), mailed May 2, 2007 (5 pages).

* cited by examiner

Fig. 1A

V= Vinp - Vinn

*Fig. 1B*

V= Voutp - Voutn

APPARATUS AND METHOD FOR IMPEDANCE MATCHING IN A BACKPLANE SIGNAL CHANNEL

TECHNICAL FIELD

The present invention relates generally to communication in a backplane signal channel and in particular, but not exclusively, to improving signal quality through impedance matching in a backplane signal channel.

BACKGROUND

Figure 1A:
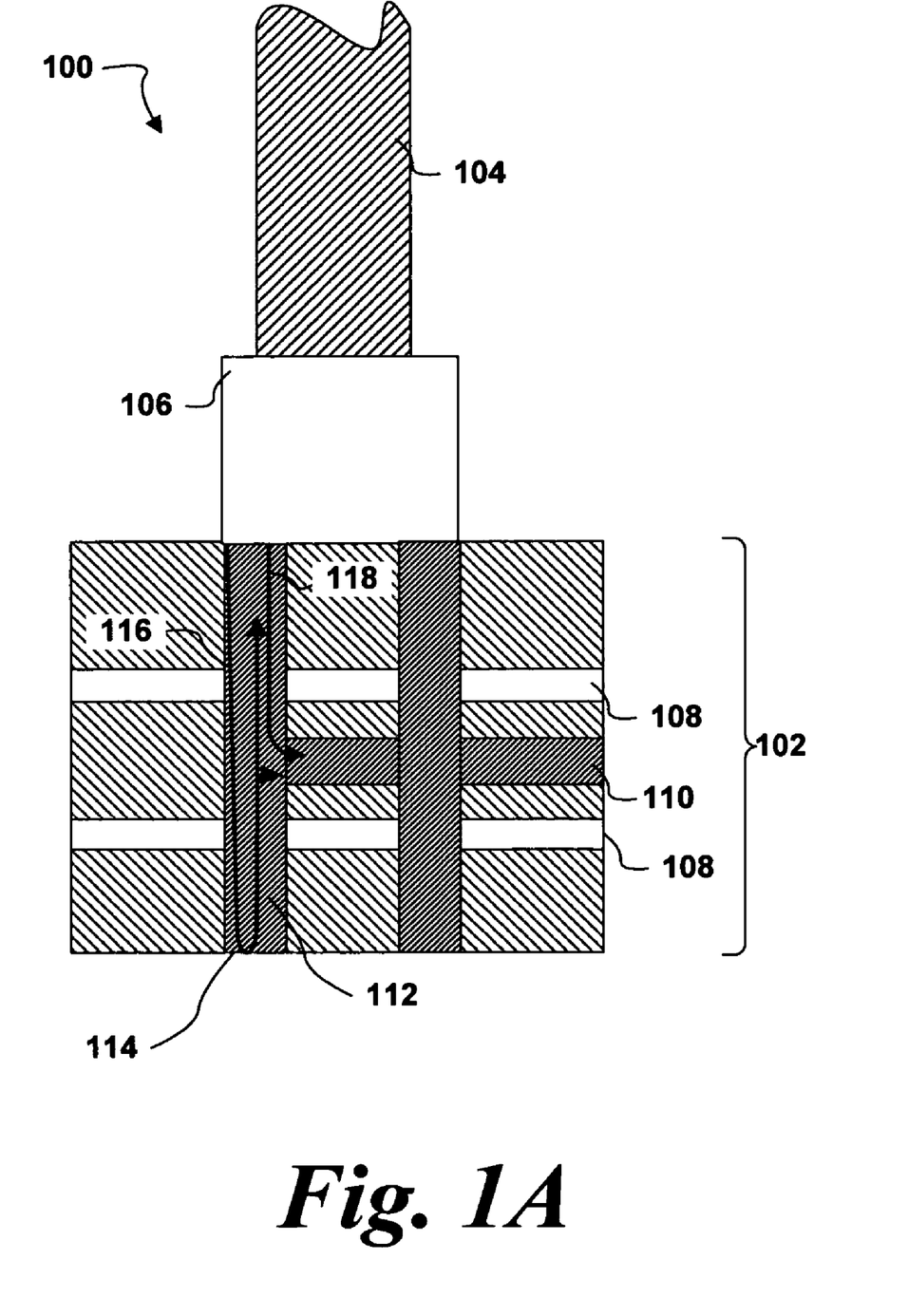
FIG. 1A is a cross section showing the communication of a server blade with and through a backplane.

FIG. 1A illustrates an embodiment of a blade server 100, which includes a printed circuit board known as a backplane 102. Blade 104, which in one embodiment is a server, is mechanically attached and electrically coupled to the backplane 102 using socket 106. Blade 104 uses backplane 102 to communicate with other blades also coupled to the backplane through a signal channel 110 within backplane 102. Blade 104 communicates with signal channel 110 through one or more stubs 112 that extend through the thickness of the backplane. For example, blade 104—or, more specifically, circuitry on blade 104—communicates with channel 110 via stub 112.

FIG. 1A illustrates a phenomenon that occurs when a signal is sent or received by blade 104 through stub 112. For example, when a signal originating from blade 104 is launched into stub 112, a first part 118 of the signal travels down the stub and into the channel 110. A second part 116 of the signal, however, travels to the end of stub 112. When the second part 116 of the signal arrives at the end 114 of the stub, it reflects from the end and travels back up stub 112 and at least partly into channel 110. If the data rate of the signal is low and the length of signal channel 112 is small, the reflection of the signal from the stub end usually does not create serious problem, but when the data rate of the signal is high and the length L of signal channel 112 is large, more serious problems begin to occur.

Figure 1B:
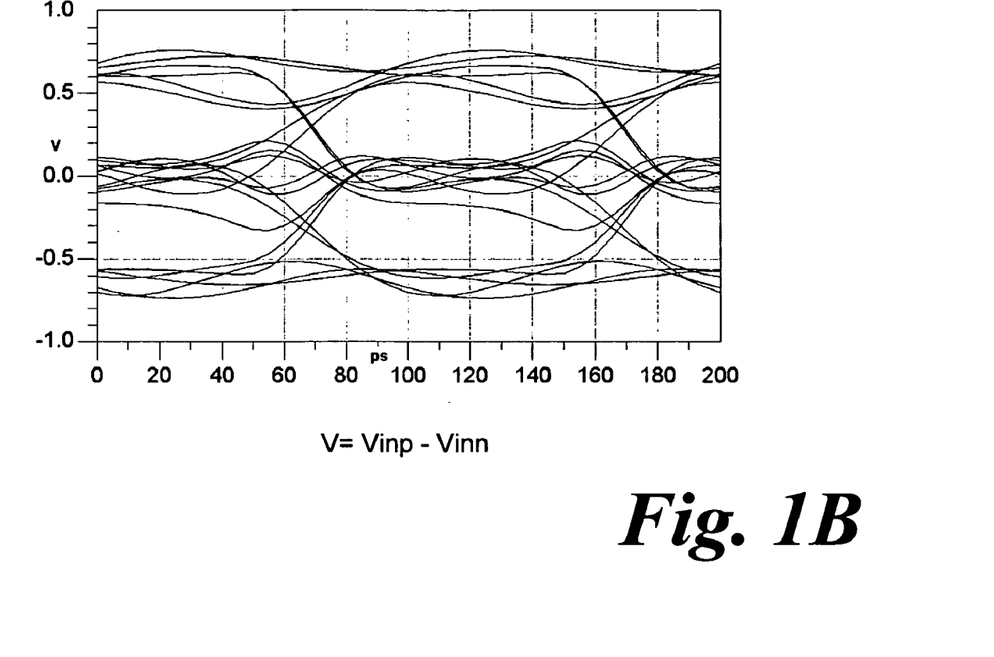
FIG. 1B is a plot of differential input voltage versus time for an embodiment of a server such as the one shown in FIG. 1A.
Figure 1C:
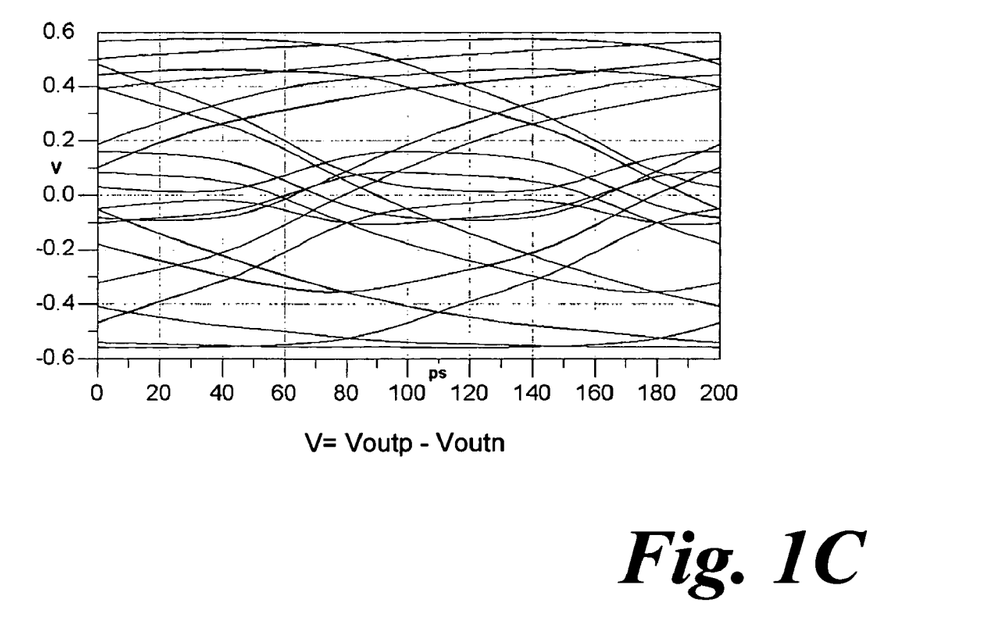
FIG. 1C is a plot of differential output voltage versus time for an embodiment of a server such as the one shown in FIG. 1A.

FIGS. 1C and 1D illustrate the problem that occurs with a long signal channel 112 and a high data rate differential signal. FIG. 1B illustrates the differential input signal, measured by the voltage difference between the positive input voltage Vinp and negative input voltage Vinn at the locations shown on blade 204 in FIG. 2A. FIG. 1C illustrates the differential output signal, measured by the voltage difference between the positive output voltage Voutp and negative output voltage Voutn at the locations shown on blade 204 in FIG. 2A. Normally, both FIGS. 1B and 1C should exhibit the well-known "open eye" pattern characteristic of differential signals, and in a perfect communication system, the eye pattern at the input would be perfectly replicated at the output—in other words, the output pattern in FIG. 1C would look exactly like the input pattern in FIG. 1B. Both figures shown that, due to the signal reflection phenomenon discussed above in FIG. 1A, the expected "open eye" pattern becomes somewhat distorted at the input and much more substantially distorted at the output. So much distortion can occur that, as shown in FIG. 1C, the "open eye" pattern closes meaning, essentially, that the signal has become scrambled. The voltage spread has also narrowed, meaning that signal energy has been lost between blades. Among other things, this makes it difficult to decode the signal when it is received.

Current ways of dealing with this problem focus on active solutions that attempt, within the circuitry of the blade receiving a signal, to condition and decode a differential signal. These current solutions, however, are complex and expensive. One passive approach that has been tried is to simply increase the signal power at the input. Unfortunately, though, this approach only affects the voltage spread at the output but does nothing about the closing of the "eye" that occurs between input and output.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a system and method for impedance matching in a backplane signal channel are described herein. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 2A:
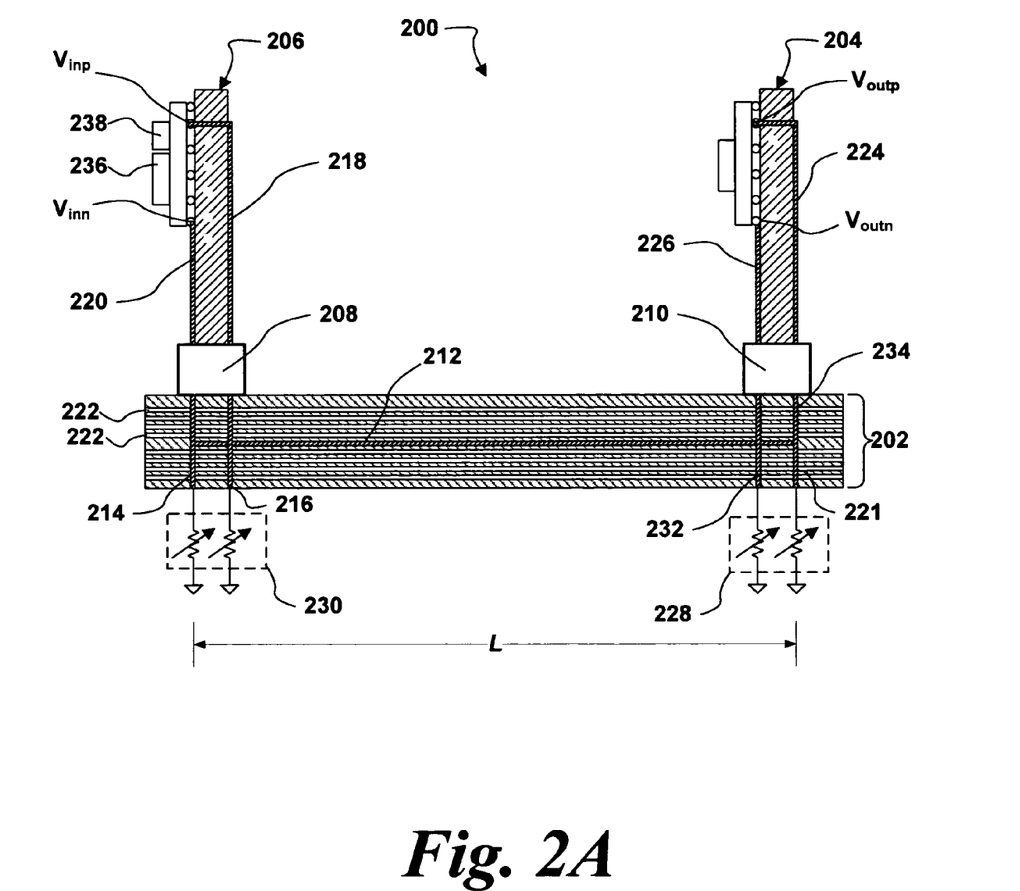
FIG. 2A is a side elevation of an embodiment of a blade server according to the present invention.

FIG. 2A illustrates an embodiment of a device comprising a blade server 200 according to the present invention. Although a blade server is used herein for purposes of illustration, in other embodiments the device 200 can be something besides a blade server. The blade server 200 includes a first blade 206 and a second server blade 204, both of which are electrically and mechanically coupled to a backplane 202. Blades 204 and 206 are electrically coupled to a signal channel 212 in the backplane using one or more stubs that extend throughout the thickness of the backplane. For example, blade 206—or, more specifically, circuitry on blade 206—is coupled with signal channel 212 via trace 218 that is electrically coupled to stub 216, and by trace 220 that is electrically coupled to stub 214. Similarly, circuitry on blade 204 is coupled with signal channel 212 via trace 224 that is electrically coupled to stub 234 and by trace 226 that is electrically coupled to stub 232. By virtue of their electrical coupling to signal channel 212, blades 204 and 206 can communicate with each other through signal channel 212 within backplane 202.

Backplane 202 includes a front side to which blades 204 and 206 are coupled, and a backside to which components such as impedance matching terminals 228 and 230 are coupled as further discussed below. In one embodiment of backplane 202, the backplane is a printed circuit board including multiple conductive layers 222 separated from each other by insulating layers 221. The conductive layers alternate between signal layers and ground layers—for example, if one particular layer is a signal layer the next layer in the stack in either direction is a ground layer (see FIG. 3). In one embodiment, the conductive layers are made of a metal such as copper, but in other embodiments the conductive layers can, of course, be made of other metallic or non-metallic conductors. Similarly, in one embodiment insulating layers 221 are made of a dielectric such as FR4, or Nelco 4000-13, both the Nelco California subsidiary of Park Electrochemical Corp. of Melville, N.Y., USA.

The front side of backplane 202 includes a socket 208 through which blade 206 is mechanically attached and electrically coupled to backplane 202, as well as a socket 210 through which blade 204 is mechanically attached and electrically coupled to backplane 202. Stubs 214 and 216 extend through the thickness of the backplane and are used to electrically couple blade 206 to signal channel 212 via socket 208. Similarly, stubs 232 and 234 extend through the thickness of backplane 202 and are used to electrically couple blade 204 to signal channel 212 via socket 210. In one embodiment, stubs 214, 216, 232 and 234 are electrically coupled only to one of the conductive layers within the backplane and are insulated from the remaining conductive layers; in the illustrated embodiment, stubs 214, 216, 232 and 234 are electrically coupled to signal channel 212. Although not shown in the drawing, in one embodiment the signal channel 212 comprises a pair of channels through which a differential signal can be transmitted. Where the signal channel comprises a differential channel pair, stubs 214 and 234 can be coupled to one of the channels in the pair, while stubs 216 and 232 are coupled to the other channel in the pair. With this arrangement, blades 206 and 204 communicate with each other via differential signals.

Blades 204 and 206, are mechanically attached and electrically coupled to backplane 102 using sockets 208 and 210, respectively. In one embodiment, blades 204 and 206 can be individual servers. Taking blade 206 as an example, the blade can include thereon components such as a microprocessor 236, as well as a memory 238 which in various embodiments can be a random access memory (RAM), dynamic random access memory (DRAM), static random access memory (SRAM), static dynamic random access memory (SDRAM), read-only memory (RAM), or flash memory. Other embodiments of blades 204 and 206 can, of course, be devices other than servers and can include more, less or different components than processor 236 and memory 238. Moreover, in the embodiment shown the components are coupled to the blade using a ball grid array (BGA), but in other embodiments the components can be coupled to the blade differently.

An impedance matching terminal 228 is electrically coupled to one or more of stubs 214 and 216 and to a ground. Similarly, an impedance matching terminal 230 is coupled to one or more of stubs 232 and 234 and to ground. In the illustrated embodiment, impedance matching terminals 228 and 230 both include a pair of resistors, one coupled to each stub and to ground. Although shown connected to an external ground (e.g., a ground that is not on the blade server 200), the impedance matching terminals can also be grounded in the blade server itself (see FIG. 3). Variable resistors are shown in the figure, but in other embodiments fixed resistors can be used. In still other embodiments impedance matching terminals that include other electrical components such as capacitors and inductors can be used (see FIGS. 4A-4D, 5A-5B, 6A-6B and 7) instead of or in addition to fixed or variable resistors. In yet other embodiments, electrical components besides resistors, capacitors and inductors can be used instead of or in addition to these components.

The particular values of resistance, capacitance, inductance, etc. used in the impedance matching terminal will depend on such factors as the data rate of the signal transmitted through the stubs and signal channel, as well as the length L of the signal channel. For example, when a resistor is used as an impedance matching terminal with a signal channel having a length of about 9 inches or greater that is carrying a signal with a data rate at or exceeding about 9 gigabits per second (10 Gbps), a resistance of about 25 ohms has been found to be optimum. In other embodiments where the impedance matching terminal is a resistor, it is expected that a longer signal channel will require a lower resistance.

Figure 2B:
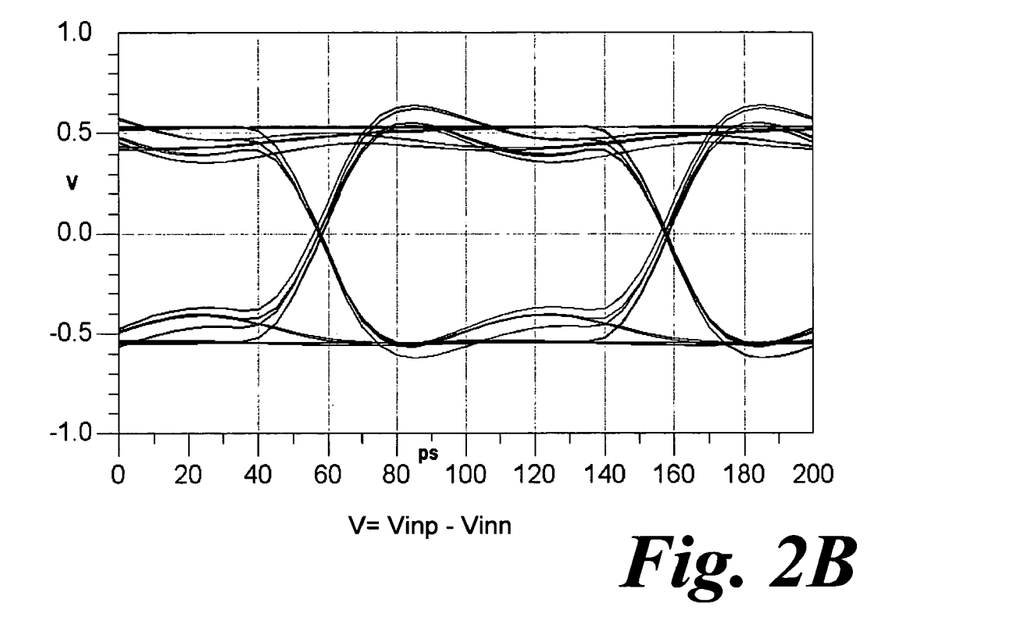
FIG. 2B is a plot of differential input voltage versus time for an embodiment of a blade server such as the blade server of FIG. 2A.
Figure 2C:
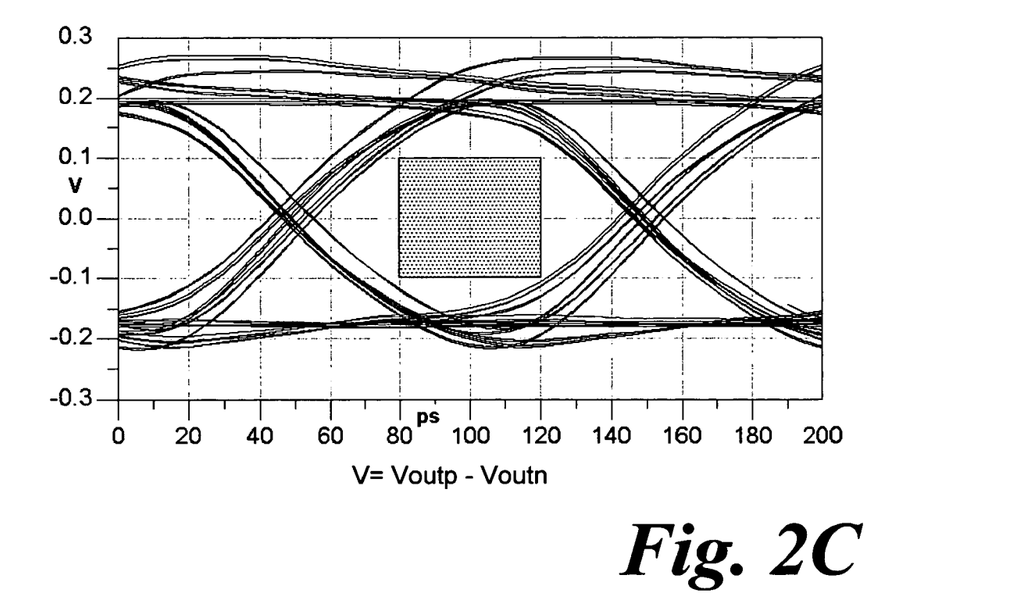
FIG. 2C is a plot of differential output voltage versus time for an embodiment of a blade server such as the blade server of FIG. 2A.

FIGS. 2B and 2C illustrate the effect of attaching impedance matching terminals to the stub ends as shown in FIG. 2A. FIG. 2B illustrates the differential input signal, measured by the voltage difference between the positive input voltage Vinp and negative input voltage Vinn at the locations shown on blade 206 in FIG. 2A. FIG. 2C illustrates the differential output signal, measured by the voltage difference between the positive output voltage Voutp and negative output voltage Voutn at the locations shown on blade 204 in FIG. 2A.

FIG. 2B, as a result of the impedance matching terminals applied to the stub ends, now exhibits the familiar "open eye" pattern associated with a differential signal. Similarly, whereas the differential output signal was previously distorted by signal reflection from the stub end, FIG. 2C now also exhibits the familiar "open eye" pattern associated with a differential signal. The shaded square in the middle of the eye in FIG. 2C represents the design requirement imposed by the Advanced Telecom Computing Architecture (ATCA) 3.0 standard, published January 2003 by the PCI Industrial Computer Manufacturers Group (PICMG). The ATCA standard requires at least a 0.2 volt spread in the signal so that the signal can be decoded. Thus, the impedance matching terminals substantially affect compliance with this specification for long signal channels and high data rates. In a perfect communication system, the eye pattern at the input would be perfectly replicated at the output—in other words, the output pattern in FIG. 2B would look exactly like the input pattern in FIG. 2C. FIG. 2C, however, shows that the "open eye" of the output pattern no longer closes, although the signal's voltage spread still decreases due to signal energy lost in the signal channel.

Figure 3:
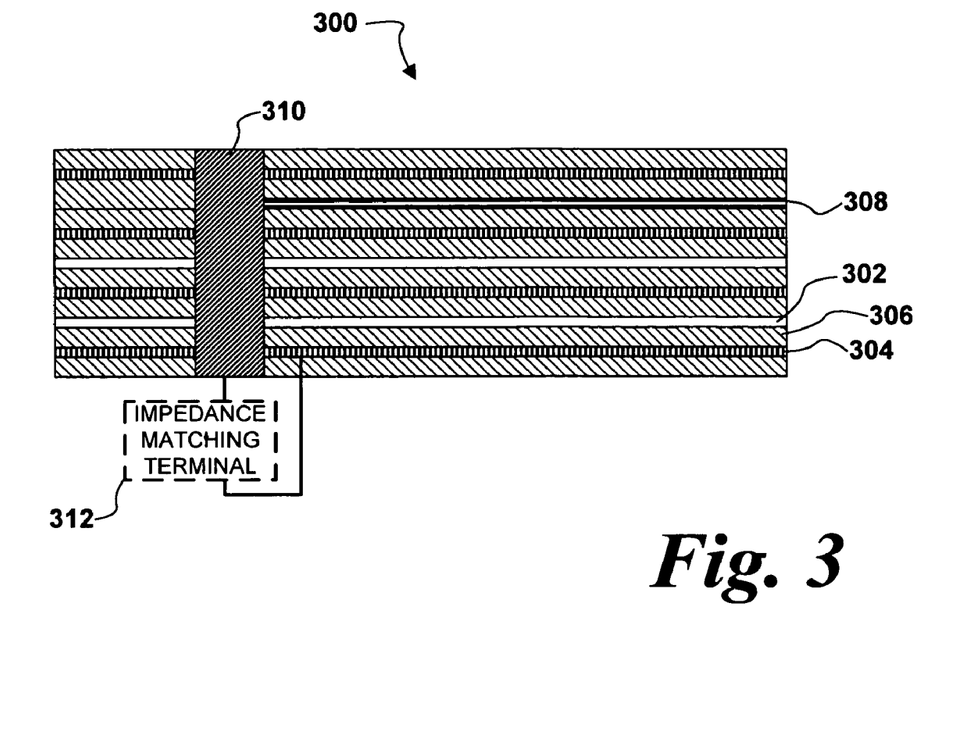
FIG. 3 is a cross-section of an embodiment of a backplane illustrating an embodiment of the grounding of an impedance matching terminal.

FIG. 3 illustrates an embodiment of a backplane 300 illustrating an embodiment of grounding an impedance matching terminal. The backplane 300 is essentially a printed circuit board that includes alternating signal layers 302 and ground layers 304, with an insulating layer 306 separating the ground layers and signal layers. A stub 310 extends through the thickness of backplane 300 and is electrically coupled to signal channel 308, which is formed in one of the conductive layers. An impedance matching terminal 312 is electrically coupled to stub 310 and is grounded by coupling it to ground layer 304 within backplane 300. In the embodiment shown, the impedance matching terminal is grounded in the ground layer 304 closest to the backside of backplane 300, but in other embodiments the impedance matching terminal can be grounded in some other layer within the backplane. In embodiments where the impedance matching terminal 312 requires more than one ground (see FIGS. 4A-4D, 5A-5B, 6A-6B and 7), both grounds can be coupled to the same ground layer within backplane 300 or can be coupled to different ground layers.

Figure 4A:
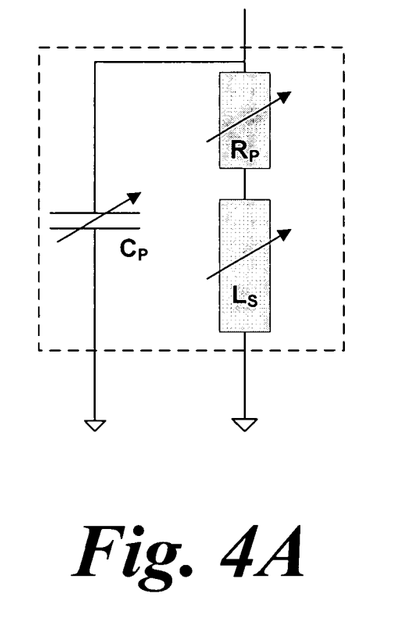
FIGS. 4A-4E are schematics of embodiments of impedance matching terminals using combinations of resistors, capacitors and inductors.
Figure 4B:
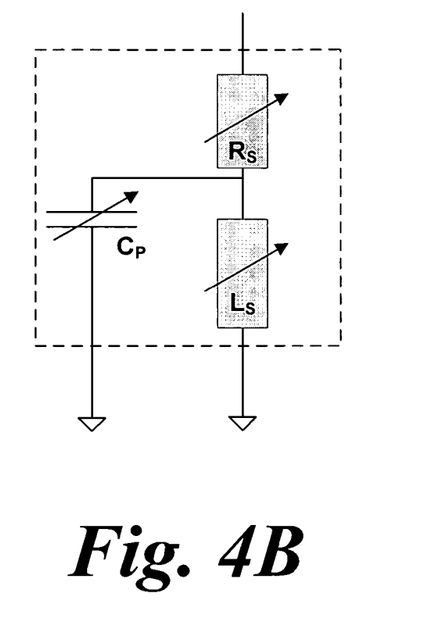

FIGS. 4A-4E illustrate embodiments of impedance matching terminals that can be used in the device 200 shown in FIG. 2A. FIG. 4A illustrates an embodiment comprising a variable shunt capacitor $C_P$ followed by a variable in-line resistor $R_P$ and a variable in-line inductor $L_S$. In other embodiments, the components can be fixed instead of variable and values for the resistance, capacitance and inductance of the components shown in FIG. 4A can be determined analytically or empirically. FIG. 4B illustrates an embodiment similar to the embodiment of FIG. 4A, except that the position of the variable shunt capacitor is changed so that this embodiment includes a variable in-line resistor $R_S$ followed by a variable shunt capacitor $C_P$ and a variable in-line inductor $L_S$. In other embodiments, the components can be fixed instead of variable and values for the resistance, capacitance and inductance of the components shown in FIG. 4B can be determined analytically or empirically.

Figure 4C:
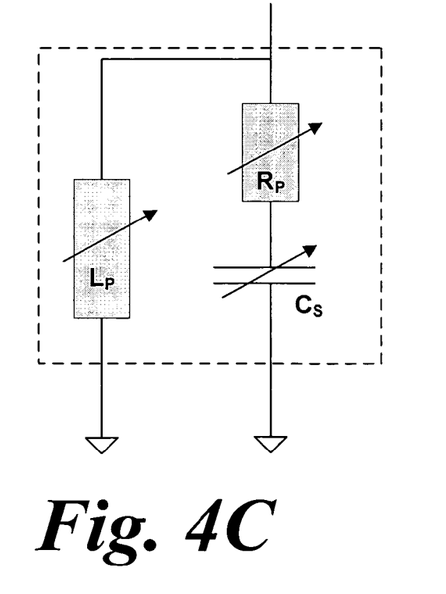
Figure 4D:
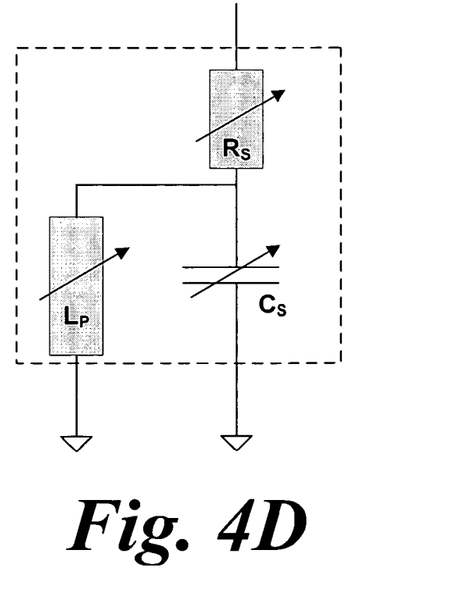

FIG. 4C illustrates an embodiment similar to the embodiment of FIG. 4A, except that the positions of the capacitor and inductor are transposed. This embodiment, then, includes a variable shunt inductor $L_P$ followed by a variable in-line resistor $R_P$ and a variable in-line capacitor $C_S$. In other embodiments, the components can be fixed instead of variable and values for the resistance, capacitance and inductance of the components shown in FIG. 4C can be determined analytically or empirically. FIG. 4D illustrates an embodiment similar to the embodiment of FIG. 4C, except that the position of the shunt inductor is changed. This embodiment, then, comprises a variable in-line resistor $R_S$, followed by a variable shunt inductor $L_P$ and a variable in-line capacitor $C_S$. In other embodiments, the components can be fixed instead of variable and values for the resistance, capacitance and inductance of the components shown in FIG. 4D can be determined analytically or empirically.

Figure 4E:
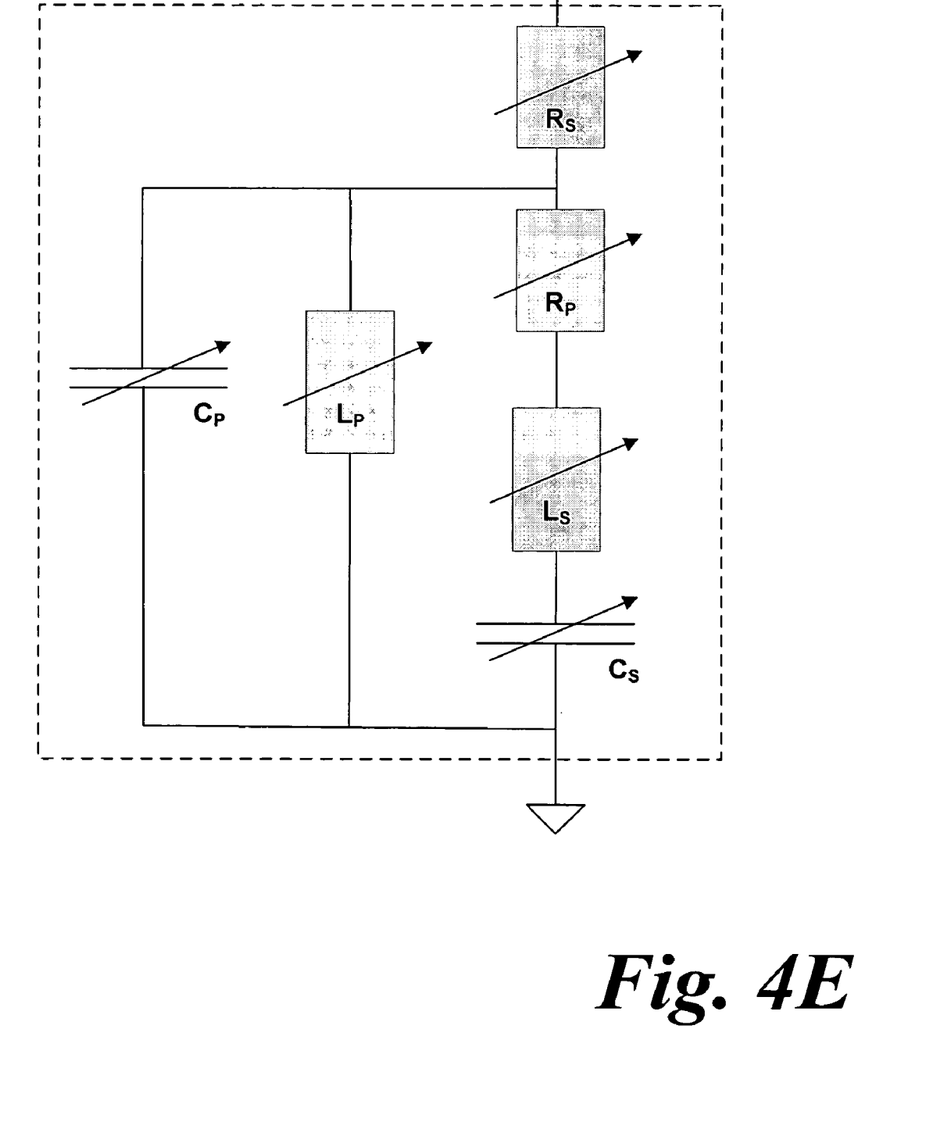

Fire 4E illustrates yet another embodiment of an impedance matching terminal that can be used in the device 200 shown in FIG. 2A. This embodiment includes a variable in-line resistor $R_S$, followed by a variable shunt inductor $L_P$ and a variable shunt capacitor $C_P$, followed by a variable in-line resistor $R_P$, variable in-line inductor $L_S$ and variable in-line capacitor $C_S$. In other embodiments of this impedance matching terminal, the components can be fixed instead of variable and values for the resistance, capacitance and inductance of the components shown in FIG. 4D can be determined analytically or empirically.

Figure 5A:
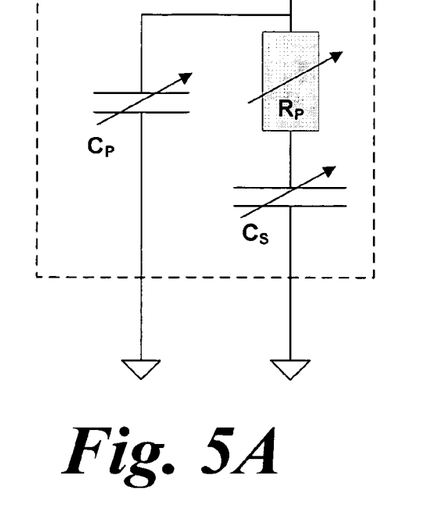
FIGS. 5A-5B are schematics of embodiments of impedance matching terminals using resistors and capacitors.
Figure 5B:
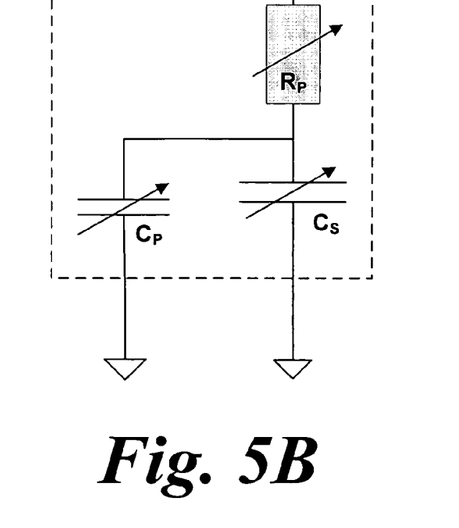

FIGS. 5A-5B illustrate additional embodiments of an impedance matching terminal that can be used in device 200.

FIG. 5A illustrates an embodiment of an impedance matching terminal that includes a variable shunt capacitor $C_P$ followed by a variable in-line resistor $R_P$ and a variable in-line capacitor $C_S$. Similarly, FIG. 5B illustrates an embodiment of an impedance matching terminal that includes a variable in-line resistor $R_P$ followed by a variable shunt capacitor $C_P$ and a variable in-line capacitor $C_S$. For the embodiments shown in FIGS. 6A and 6B, the resistances and capacitances can be determined analytically or empirically and, in other embodiments the components shown can be fixed instead of variable.

Figure 6A:
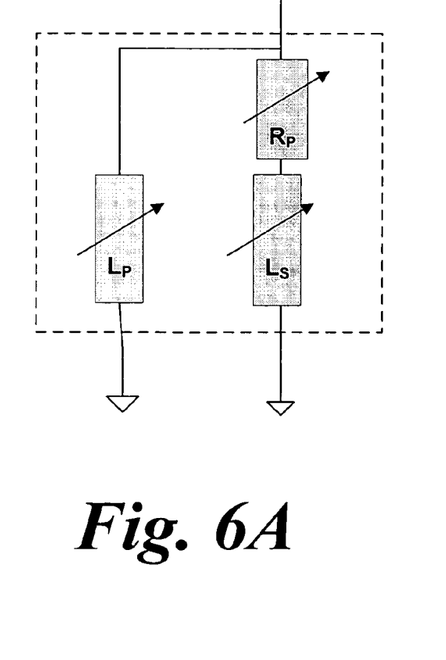
FIGS. 6A-6B are schematics of embodiments of impedance matching terminals using resistors and inductors.
Figure 6B:
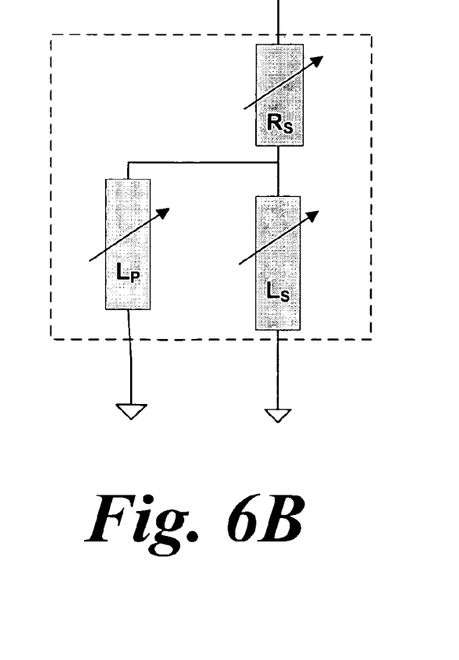

FIGS. 6A-6B illustrate further alternative embodiments of the impedance matching terminal that can be used in device 200. FIG. 6A illustrates an embodiment of an impedance matching terminal that includes a variable shunt inductor $L_P$ followed by a variable in-line resistor $R_P$ and a variable in-line inductor $L_S$. Similarly, FIG. 6B illustrates an embodiment of an impedance matching terminal that includes an variable in-line resistor $R_S$ followed by a variable shunt inductor $L_P$ and an variable in-line inductor $L_S$. For the embodiments shown in FIGS. 6A and 6B, the resistances and inductances can be determined analytically or empirically and, in other embodiments the components shown can be fixed instead of variable.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
   a printed circuit board having a front side and a back side, and having therein a plurality of conductive layers, at least one of the conductive layers including first and second signal channels to carry a differential signal pair of a server blade, the printed circuit board to provide a backplane for the server blade;
   first and second stubs, each of the first stub and the second stub having a length extending from a respective front end of the each stub at the front side through the printed circuit board to a respective back end of the each stub at the back side, the first stub being electrically coupled to the first signal channel and the second stub being electrically coupled to the second signal channel;
   a socket coupled to the front side of the printed circuit board, the socket to receive the server blade, wherein the received server blade is electrically coupled to the first and second stubs at the respective front ends of the first and second stubs to provide a respective signal of the differential signal pair to each of the first and second stubs; and
   a first impedance matching terminal and a second impedance matching terminal, each of the first and second impedance matching terminals electrically coupled to a respective one of the first and second stubs at a respective one of the back ends of the first and second stubs, each of the first and second impedance matching terminals further electrically coupled to a ground, each of the first and second impedance matching terminals to reduce a reflection of a portion of the respective provided signal at the respective back end of one of the first and second stubs.

2. The apparatus of claim 1 wherein the ground is a ground external to the printed circuit board.

3. The apparatus of claim 1 wherein the plurality of conductive layers includes alternating signal layers and ground layers separated from each other by insulating layers.

4. The apparatus of claim 3 wherein the ground is one or more of the ground layers.

5. The apparatus of claim 1 wherein the impedance matching terminal is a variable resistor.

6. The apparatus of claim 1 wherein the impedance matching terminal includes at least one of a capacitor and an inductor.

7. The apparatus of claim 1 wherein a signal traveling through the signal channel has a data rate of approximately 9 gigabits per second (Gbps) or greater.

8. The apparatus of claim 1 wherein a length of the signal channel is approximately 9 inches or greater.

9. A system comprising:
a printed circuit board having a front side and a back side, and including therein a plurality of conductive layers, at least one of the conductive layers including first and second signal channels to carry a differential signal;
first and second stubs, each of the first stub and the second stub having a respective length extending from a respective front end of the each stub at the front side through the printed circuit board to a respective back end of the each stub at the back side, the first stub being electrically coupled to the first signal channel and the second stub being electrically coupled to the second signal channel;
a server blade coupled to the front side of the printed circuit board and electrically coupled to the first and second stubs at the respective front ends of the first and second stubs, the server blade to provide a respective signal of a differential signal pair to each of the first and second stubs, the server blade including thereon a processor and an SDRAM memory; and
a first impedance matching terminal and a second impedance matching terminal, each impedance matching terminal positioned on the back side of the printed circuit board and connected to a respective one of the first and second stubs at a respective one of the back ends of the first and second stubs, each impedance matching terminal further connected to a ground, each impedance matching terminal to reduce a reflection of a portion of the respective provided signal from the respective back end of one of the first and second stubs.

10. The system of claim 9 wherein the ground is a ground external to the printed circuit board.

11. The system of claim 9 wherein the plurality of conductive layers includes alternating signal layers and ground layers separated from each other by insulating layers.

12. The system of claim 11 wherein the ground is one or more of the ground layers.

13. The system of claim 9 wherein the impedance matching terminal is a variable resistor.

14. The system of claim 9 wherein the impedance matching terminal includes at least one of a capacitor and an inductor.

15. The system of claim 9 wherein a signal traveling through the signal channel has a data rate of approximately 9 gigabits per second (Gbps) or greater.

16. The system of claim 9 wherein a length of the signal channel is approximately 9 inches or greater.

* * * * *